United States Patent

[11] 3,574,925

[72] Inventors Jens R. W. Schneider;
Jorg S. Gehrke; Werner Lubbe,
Wedel,Holstein, Germany

[21] Appl. No. 782,092
[22] Filed Dec. 9, 1968
[45] Patented Apr. 13, 1971
[73] Assignee Licentia Patent-Verwaltungs-G.m.b.H.
Frankfurt Am Main, Germany
[32] Priority Dec. 7, 1967
[33] Germany
[31] P 16 27 545.9

[54] SOLDERING PROCESS
1 Claim, 4 Drawing Figs.

[52] U.S. Cl. ........ 29/487, 29/493, 29/495, 29/498, 29/572, 136/89
[51] Int. Cl. ........ B23k 31/02
[50] Field of Search ........ 136/89, 206; 29/572; 29/487, 495, 498, 493

[56] References Cited
UNITED STATES PATENTS

| | | | |
|---|---|---|---|
| 3,080,648 | 3/1963 | Thomas | 29/498X |
| 3,094,439 | 9/1964 | Mann et al. | 136/89 |
| 3,111,352 | 11/1963 | Theodoseau | 136/89X |
| 3,147,414 | 9/1964 | Pelfrey et al. | 136/89UX |
| 3,330,700 | 7/1967 | Golub et al. | 136/89 |
| 3,376,164 | 4/1968 | Bachwansky | 136/89 |
| 3,446,676 | 5/1969 | Webb | 136/89 |
| 3,459,597 | 8/1969 | Baron | 136/89 |
| 3,493,437 | 2/1970 | Webb | 136/89 |
| 3,035,339 | 5/1962 | Matter et al. | 29/495 |
| 2,867,037 | 1/1959 | Lawton | 29/487 |

*Primary Examiner*—John F. Campbell
*Assistant Examiner*—Ronald. J. Shore
*Attorney*—Spencer & Kaye

ABSTRACT: Soldering process for connecting contacts on a plurality of solar cells to form groups of parallel-connected solar cells, which groups are connected in series with each other, including the steps: Applying a solder to upper side contacts of the solar cells of a first group and to surfaces of contact-making elements to be connected with the underside contacts of the solar cells of a second group; applying a fluxing agent solution to the soldering areas of the contact-making elements; placing the solar cells and contact-making elements onto a soldering device with the contact-making elements covering the undersides of the solar cells of the first group and the upper side contacts of the solar cells of the second group; inserting such soldering device together with the items placed thereon into a soldering bath; and removing fluxing agent residues from the solar cells. An improved contact-making element and soldering device for practicing such process.

Inventors:
Jens R. W. Schneider
Jörg S. Gehrke
Werner Lubbe
By: Spencer & Kaye
Attorneys

SOLDERING PROCESS

BACKGROUND OF THE INVENTION

The present invention relates to a soldering process for connecting the contacts of a plurality of solar cells whose contacts are disposed on the underside of one edge region and on the upper side of the opposite edge region.

In order to form groups of two or more parallel-connected solar cells, the contacts on the underside are connected with each other as are the contacts on the upper side. When more than one of such groups are to be series connected, the contacts on the underside of a first group are connected with the contacts on the upper side of a second group by utilizing contact-making elements and a soldering device to hold the solar cells.

The individual contacts of solar cells which are to be connected in parallel and in series are usually connected by means of individual contact-making elements which are each individually fastened to the solar cell contacts by soft soldering. For this purpose, each individual soldering point is provided with a fluxing agent and with solder. A manually guided soldering iron serves as the heat applicator. Heat is applied by the soldering iron to each individual soldering point to produce the solder connection. Thus, the connection of the contacts alone develops into an extremely lengthy process which has the particular disadvantage, in addition to the high production costs involved, that a duplicatable solder connection can not be produced. This is due, on the one hand, to the manual control of the soldering iron and, on the other hand, to the fluctuations in thermal energy applied to the individual solder points. Such fluctuations originate from temperature variations in the soldering iron and varying soldering times. For application to solar cells, particularly in the space art, such unduplicatable solder connections are not suitable. A soldering process performed in a soldering furnace, possibly with a protective-gas atmosphere, does offer the assurance that duplicatable environmental conditions can be produced for the soldering process. However, due to the necessity of longer heating periods and the sensitivity of the solar cells to extended exposure to soldering temperatures, such a process is not suitable.

SUMMARY OF THE INVENTION

It is, therefore, the object of the present invention to provide a soldering method for connecting the contacts of a plurality of solar cells in such a manner that the production expenditures for the soldering process are reduced while the above-described drawbacks are eliminated and which, most of all, makes possible the realization of duplicatable soldered connections.

This object is accomplished according to the present invention by a soldering process comprising the following process steps:

a. applying a relatively soft solder (e.g., Sn 60 percent, PB 36 percent, Ag 4 percent) having a layer thickness of approximately 30$\mu$m. for the purpose of simultaneously providing a parallel and a series connection to the contacts on the upper side of the solar cells and to the areas of the contact-making elements which are to be connected with the underside contacts of the solar cells of a first group and the upper side contacts of the solar cells of a second group, as a consequence of which parallel and series connections can be formed simultaneously for the solar cells;

b. applying a fluxing agent solution (e.g., collophonium, which is dissolved in alcohol) to the soldering areas of the contact-making elements;

c. after evaporation of the solvent of the fluxing agent solution, placing the solar cells and the contact-making elements together so that the soldering areas of the contact-making elements cover the underside contacts of the solar cells of the first group and the upper side contacts of the solar cells of the second group, respectively, and securing them against displacement in a soldering device;

d. thereafter inserting the soldering device with the solar cells and the contact-making elements thereon into a soldering bath, maintained at approximately 240° C., to such a depth that the solder comes into contact with only the underside of the soldering device, thereby to transfer to the soldering areas thermal energy required to solder the contacts of the solar cells; and e. placing the soldered solar cells into an ultrasonic bath including a fluxing agent solvent for removing fluxing agent residues.

The soldering process according to the present invention facilitates the production of duplicatable solder connections and significantly reduces production expenditures, since now a plurality of solder connections can be produced simultaneously.

In order to produce the thermal energy required for the individual solder connections, the soldering process employs a known soldering bath device which contains the conventional tin bath as its solder bath. The tin in the bath, however, is not used as solder for the intended solder connections; its purpose here is only to act as thermal energy carrier. In order to assure that first the working temperature of the fluxing agent and thereafter the melting temperature of the solder employed are reached when the soldering device is inserted into the bath, while simultaneously keeping the period over which the soldering temperature affects the solar cells as short as possible, the optimum insertion and withdrawal speeds as well as the optimum period of detention in the bath have been determined by experimentation. The speed with which the soldering device is inserted into the solder bath is preferably about 40 mm./sec., while the period of detention within the bath is about 30 sec. and the speed with which the soldering device is withdrawn from the bath is about 30 mm./sec.

To accomplish the soldering process, the present invention proposes a contact-making element which is in the form of a contact angle. This contact angle simultaneously acts as the mechanical connecting member. Moreover, the contact angle simultaneously connects, on the one hand, the contacts on the underside of the solar cells of the first parallel-connected group with each other and, on the other hand, the contacts on the upper side of the second parallel-connected group which is in series with the first group. Moreover, the contact angle simultaneously connects the underside contacts of the first group with the upper side contacts of the second group by means of a contact strip which forms the soldering surfaces for the underside contacts and extends along the marginal edges of the solar cells forming the first group and by means of contact bridges each of which is provided with a compensating arc which leads from the contact strips to the upper side contacts of the second group.

With such a contact angle almost any number of adjacently arranged solar cells comprising a first group can be connected to each other at their underside contacts and correspondingly any number of adjacently arranged solar cells comprising a second group can be connected at their upper side contacts. Simultaneously, the underside contacts of the first group can be connected with the upper side contacts of the second group in order to provide a series connection. All this can be accomplished by a single insertion into the soldering device. The contact angle here acts as an electrically conductive bridge as well as a mechanical connecting member and is provided with individual contact bridge elements which extend in the form of branches from the contacting strip. Each of the contact bridges has a compensating arc, the cross section of each of the contact bridges being in the form, substantially, of an S-profile. Each respective compensating arc allows relative movement of the individual solar cells in the direction of the contact bridges. The contact bridges can also consist of a continuous unit. For the present use, however, the provision of individual contact bridges is recommended since the weight of the contact angles must be kept low and a certain resiliency of the contact angle is also necessary for the possible lateral displacements of the groups of solar cells with respect to each other.

Silver-laminated molybdenum, for example, when it is provided with a platinum intermediate layer as an adhesive base for the silver layer has proven to be a suitable material from which to make the contact angles.

In order to carry out the soldering process of the present invention, the present invention further proposes a soldering device which is characterized by a support plate to hold a plurality of groups of solar cells arranged one behind the other. Such groups are each formed of at least two parallel-disposed solar cells. A pressure pin is associated with each solar cell and is pivotally disposed on the longitudinal edge of the support plate. Such pin can be pivoted onto the surface of the associated solar cell to exert a contact pressure thereon by means of a spring. Additionally, holes are provided in the support plate along the edges of the individual solar cells. Guide pins fastened to a removable auxiliary support plate are inserted into such holes from the underside of the support plate in such a manner that the individual solar cells are secured against displacement until the pressure pins are placed on the solar cells.

The soldering device can be constructed to hold two or more solar cells arranged side by side in parallel, as well as any desired number of parallel groups arranged one behind the other. Thus, the solar cells determine the approximate width and length of the support plate. It is, however, also possible to select the dimensions of the support plate so that it can still be held by the work piece holder of the soldering bath device.

A corrosion-resistant chromium nickel steel has proven to be suitable as the material for the support plate since it is not wetted by the solder employed.

The pressure pins provided at the sides of the support plate which can be pivoted onto the solar cells have their pin ends preferably made of Teflon, since with this material damage to the solar cell surfaces is avoided. The number of pressure pins employed here corresponds to the number of solar cells the support plate can hold. If the support plate is constructed, for example, with four solar cells disposed adjacent each other across its width, then the length of the contact angles corresponds to the width of the support plate.

Two pressure pins are provided on each longitudinal edge of the support plate for the four solar cells. These pressure pins can each be joined to a common support in the form of a gate which can be pivoted onto the surface of the solar cells, or they can each be fastened separately to individual pivotal supports. The contact pressure required for sufficient security against displacement is provided by a spring which preferably engages the pivotal support at the longitudinal side of the support plate. It is, however, also possible to provide a detent position in the pivotal support and to associate the springs, as compression springs, with the individual pressure pins. The springs can here be provided with additional setting elements for setting various spring forces.

The holes provided through the support plate are provided mainly along the edges of the individual solar cells. An additional safeguard against displacement between two solar cells and a contact angle associated therewith can be achieved by providing several bores through the support plate which are disposed in corners formed between the edges of the solar cells, on the one hand, and the edges of the contact angles extending perpendicular thereto.

Before attaching the solar cells and the associated contact angles to the support plate, an auxiliary support plate is placed on the underside of the support plate. The fixed guide pins of the auxiliary support plate are then inserted through the holes of the support plate. The guide pins protrude beyond the surface of the support plate. Thereafter, the prepared solar cells and contact angles are placed on the support plate. The exact position of the solar cells and contact angles with respect to each other are determined by the guide pins. After pivoting the pressure pins onto the solar cells, the auxiliary support plate with the guide pins is removed. The forces which result from the pressure pins being in contact with the solar cells fix the position of the solar cells. This soldering device here offers the decisive advantage that the spacing between the solar cells with respect to the contact angles is always uniform and predetermined so that the prerequisite, of the individual soldering points can be duplicated. At the same time, the soldering device described above provides the prerequisite, in connection with the particular configuration of the contact-making elements, for automated production of the solder connections which are not affected by the irregularities which inevitably result from manual soldering.

FIG. **3*a*** is a detail view of the contact-making element according to the present invention.

Figure 3A:
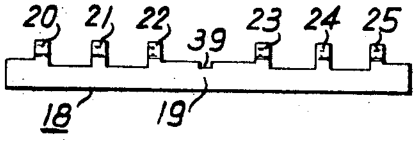

FIG. **3*b* is a longitudinal view of the contact-making element according to FIG. 3*a***.

DESCRIPTION OF THE PREFERRED EMBODIMENTS

Figure 1:
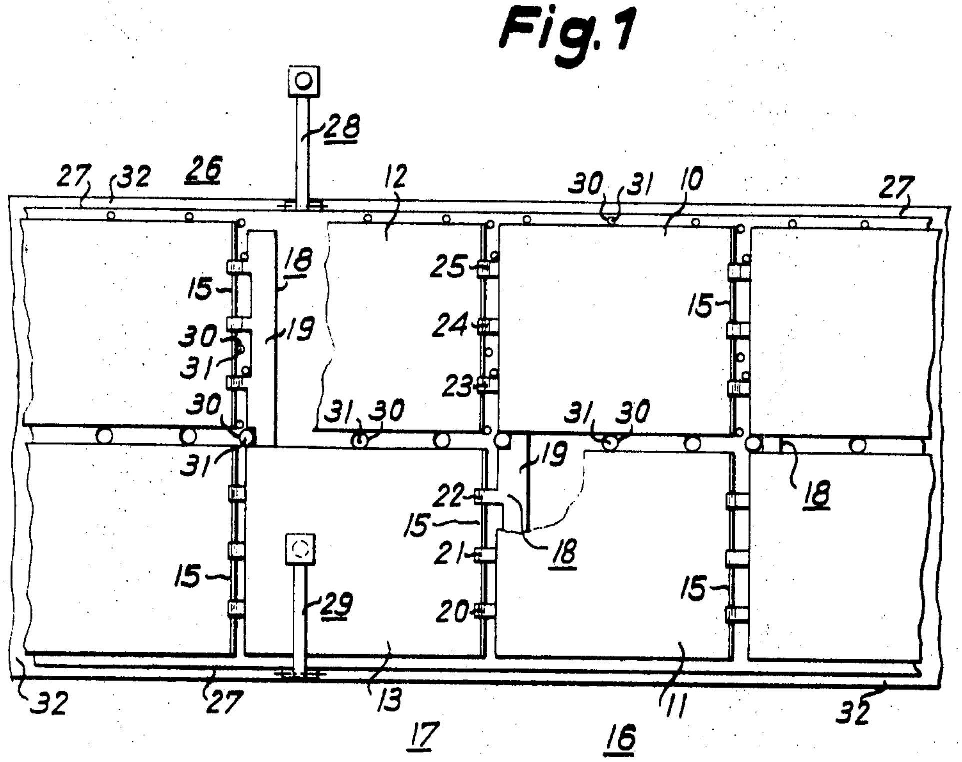
FIG. 1 is a plan view of a plurality of solar cells, some partially cut away, placed on a soldering device according to the present invention.

In FIG. 1, a plurality of solar cells 10 to 13 are shown which are provided with a contact 15 disposed on the upper side of one edge zone and with another contact 15 (not shown) disposed at the underside of the opposite edge zone. The solar cells 10 and 11 are connected in parallel to form a first group 16. To accomplish this, their upper contacts 15 as the edges as their underside contacts 15 are connected together. In the same way solar cells 12 and 13 are connected in parallel and form a second group 17 which is connected in series with the first group 16. The individual contacts 15 are connected in parallel or series by means of contact-making elements 18 having angled cross sections. The contact angles 18 each have approximately the same width as the parallel-connected group 16 or 17, respectively. They are provided with a contact strip 19 which forms the soldering area for the underside contacts 15 and which extends along the edges of the solar cells 10 and 11 or 12 and 13, respectively. From the contact strip 19 extend individual contact bridges 20 to 25, each being provided with a compensatory arc. The contact bridges 20 to 25 lead to the upper contacts (5 of group 17. The contact bridges 20 to 25 provide the soldering area for the upper contacts 15 and thereby serve to connect the contacts on the undersides of the solar cells with the upper contacts 15. One contact bridge, as for example the contact bridge 21 or 24, respectively, is sufficient to serve as an electric bridge. The remaining contact bridges are provided in order to meet the requirements for greater dependability of the contact connections. In addition to providing an electrical connection, all of the contact angles 18 serve to mechanically connect the individual solar cells with one another.

The solar cells 10 to 13 and their associated contact angles 18 are placed on a soldering device 26. The soldering device 26 is provided with a support plate 27 having pressure pins which are pivotally mounted along its two longitudinal sides. Each solar cell on support plate 27 has such an associated pressure pin assembly. In FIG. 1 only one pressure pin assembly 28 or 29, respectively, on each side of longitudinal support plate 27 and associated with solar cell 12 or 13, respectively, is shown. The pressure pin 29 is shown in its operating position where it is pivoted onto the surface of solar cell 13 and exerts a contact pressure thereagainst. Pressure pin 28, on the other hand, is shown in its initial position before being pivoted onto the solar cell. Details concerning the pressure pins will be explained below in connection with FIG. 2. Holes 30 are provided through the support plate 27 along the edges of the individual solar cells 10 to 13. The holes 30 are shown here only for the upper row of solar cells, to which belong solar cells 10 and 12. Guide pins 31 are inserted from the underside of support plate 27 through holes 30 so that they protrude beyond the surface of support plate 27. The guide pins 31 are held by an auxiliary support plate 32 which remains in contact with the lower surface of support plate 27 until pressure pins 28, 29 are pivoted into position. The guide pins 31 serve to hold the individual solar cells and the associated contact angles in fixed positions with respect to each other. Thus, time-consuming fitting processes are eliminated. Before immersing the soldering device 26 into the soldering bath, guide pins 31 together with the auxiliary support plate 32 are removed. This removes the existence of any danger that the solar cells might be damaged during removal of the guide pins after the soldering process is completed as a result of the guide pins 31 becoming difficult to remove due to warping.

Figure 2:
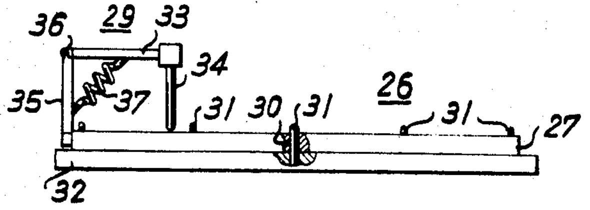
FIG. 2 is a side view without the solar cells of the soldering device of FIG. 1.

Referring to FIG. 2, this is a side view of the soldering device 26 of FIG. 1. The solar cells on the surface of the support plate 27, however, are not shown. Moreover, only pressure pin assembly 29 is shown. The pressure pin assembly 29 includes a rigid support member 35 fastened at a longitudinal side of support plate 27, a crossbar 33 pivotally connected to the support member 35 at joint 36 and a pin 34 formed, for example, of Teflon, which is fastened to the crossbar 33. To generate the contact pressure, a tension spring 37 is provided between the crossbar 33 and the support 35.

Figure 3B:

Referring to FIG. 3*a* this shows in detail the contact angle 18 of FIG. 1 with the contact strip 19 and the individual contact bridge elements 20 to 25. In the side view shown in FIG. 3*b* of the contact angle 18 of FIG. 3*a*, its S-shaped profile is visible as is the compensatory arc 38 which is provided in each individual contact bridge. The compensatory arc 38 serves for elastically movement of the solar cells of one group towards the other group which is in series with the first group. The contact angle 18 is also provided with a particular indentation 39 which has the same width as the space between two adjacently arranged solar cells. The indentation 39 is filled by one of the guide pins 31 when the solar cells and the associated contact angles 18 are applied to support plate 27. In this way the position of two adjacently arranged solar cells with respect to the associated contact angle 18 is fixed.

As discussed above, the soldering process according to the present invention is as follows:

a. applying a relatively soft solder (e.g., Sn 60, percent, Pb 36 percent, Ag 4 percent) having a layer thickness of approximately 30$\mu$m. for the purpose of simultaneously providing a parallel and a series connection to the contacts on the upper side of the solar cells and to the areas of the contact-making elements which are to be connected with the underside contacts of the solar cells of a first group and the upper side contacts of the solar cells of a second group, as a consequence of which parallel and series connections can be formed simultaneously for the solar cells;

b. applying a fluxing agent solution (e.g., collophonium which is dissolved in alcohol) to the soldering areas of the contact-making elements;

c. after evaporation of the solvent of the fluxing agent solution, placing the solar cells and the contact-making elements together so that the soldering areas of the contact-making elements cover the underside contacts of the solar cells of the first group and the upper side contacts of the solar cells of the second group, respectively, and securing them against displacement in a soldering device;

d. thereafter, inserting the soldering device with the solar cells and the contact-making elements thereon into a soldering bath maintained at approximately 240° C. to such a depth that the solder comes into contact with only the underside of the soldering device, thereby to transfer to the soldering areas thermal energy required to solder the contacts of the solar cells; and e. placing the soldered solar cells into an ultrasonic bath including a fluxing agent solvent for removing fluxing agent residues.

It will be understood that the above description of the present invention is susceptible to various modifications, changes and adaptation.

We claim:

1. A soldering process for connecting the contacts of a plurality of solar cells each having a contact on the underside thereof disposed along a first edge and a contact on the upper side thereof disposed along the edge opposite to such first edge, such cells forming groups of two or more parallel-connected solar cells with the underside contacts of the solar cells in each group being connected together and the upper side contacts of the solar cells in each such group also being connected together, such groups, moreover, being connected in series with each other by connecting the underside contacts of at least a first group with the upper side contacts of a second group, the process comprising, in combination, the steps of:

a. applying a relatively soft solder having a layer thickness of approximately 30 micrometers to the surfaces of the contact-making elements which are to be connected with the underside contacts of the solar cells of a first group and the upper side contacts of the solar cells of a second group, as a consequence of which parallel and series connections can be formed simultaneously for the solar cells;

b. applying a fluxing agent solution to the soldering areas of the contact-making elements;

c. after evaporation of the solvent of the fluxing agent solution, placing the solar cells and the contact-making elements together so that the soldering areas of the contact-making elements cover the underside contacts of the solar cells of the first group and the upper side contacts of the solar cells of the second group, respectively, and securing them against displacement in a soldering device;

d. thereafter, inserting the soldering device with the solar cells and the contact-making elements thereon into a soldering bath maintained at approximately 240° C. to such a depth that the solder comes into contact with only the underside of the soldering device thereby to transfer to the soldering areas terminal energy required to solder the contacts of the solar cells; and e. placing the soldered solar cells into an ultrasonic bath including a fluxing solvent for removing fluxing agent residues.